(12) United States Patent
Mojumder et al.

(10) Patent No.: US 9,536,596 B2
(45) Date of Patent: Jan. 3, 2017

(54) THREE-PORT BIT CELL HAVING INCREASED WIDTH

(71) Applicant: QUALCOMM Incorporated, San Diego, CA (US)

(72) Inventors: Niladri Narayan Mojumder, San Diego, CA (US); Stanley Seungchul Song, San Diego, CA (US); Zhongze Wang, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/468,976

(22) Filed: Aug. 26, 2014

(65) Prior Publication Data

US 2016/0064067 A1    Mar. 3, 2016

(51) Int. Cl.

| G11C 11/40 | (2006.01) |
|---|---|
| G11C 11/419 | (2006.01) |
| G11C 7/18 | (2006.01) |
| G11C 8/16 | (2006.01) |
| G11C 11/412 | (2006.01) |
| G11C 29/00 | (2006.01) |
| H01L 27/02 | (2006.01) |
| H01L 27/11 | (2006.01) |

(Continued)

(52) U.S. Cl.
CPC ............... *G11C 11/419* (2013.01); *G11C 7/18* (2013.01); *G11C 8/16* (2013.01); *G11C 11/40* (2013.01); *G11C 11/412* (2013.01); *G11C 29/816* (2013.01); *H01L 21/32133* (2013.01); *H01L 21/768* (2013.01); *H01L 27/0207* (2013.01); *H01L 27/1104* (2013.01)

(58) Field of Classification Search
CPC .......... G11C 11/40; G11C 11/419; G11C 8/16; G11C 11/412; G11C 29/816; H01L 21/768; H01L 21/32133; H01L 27/1104; H01L 27/0207
USPC ............ 365/154, 63, 189.03, 189.04, 230.05
See application file for complete search history.

(56) References Cited

U.S. PATENT DOCUMENTS

| 5,299,156 A * | 3/1994 | Jiang ...................... G06F 5/065 |
|---|---|---|
| | | 365/154 |
| 5,424,996 A * | 6/1995 | Martin ................. G11C 7/1078 |
| | | 365/189.05 |

(Continued)

FOREIGN PATENT DOCUMENTS

JP         2012174317 A      9/2012

OTHER PUBLICATIONS

Invitation to Pay Additional Fee With Partial International Search—PCT/US2015/041818—ISA/EPO—Oct. 22, 2015.

(Continued)

*Primary Examiner* — Tan T Nguyen
(74) *Attorney, Agent, or Firm* — Toler Law Group, PC

(57) ABSTRACT

An apparatus includes a first read port, a second read port, a write port, and at least one storage latch. A width of a bit cell that includes the first read port, the second read port, and the write port is greater than twice a contacted poly pitch (CPP) associated with the bit cell. For example, a bit cell may be a 3-port static random access memory (SRAM) bit cell that is compatible with self-aligned double patterning (SADP) processes and that can be manufactured using semiconductor manufacturing processes of less than 14 nanometers (nm).

20 Claims, 13 Drawing Sheets

(51) Int. Cl.
  *H01L 21/3213* (2006.01)
  *H01L 21/768* (2006.01)

(56) References Cited

U.S. PATENT DOCUMENTS

| | | | |
|---|---|---|---|
| 6,091,627 A | 7/2000 | Luo et al. | |
| 6,359,807 B1 | 3/2002 | Ogura et al. | |
| 6,711,086 B2 | 3/2004 | Terada | |
| 6,778,419 B2* | 8/2004 | Barry | G11C 17/12 365/174 |
| 7,738,312 B2 | 6/2010 | Shimano et al. | |
| 7,826,282 B2 | 11/2010 | Schmitt | |
| 8,174,868 B2 | 5/2012 | Liaw | |
| 8,467,214 B2 | 6/2013 | Funane et al. | |
| 8,625,334 B2 | 1/2014 | Liaw | |
| 8,675,397 B2* | 3/2014 | Liaw | 365/154 |
| 8,679,981 B1 | 3/2014 | Weling et al. | |
| 8,680,671 B2 | 3/2014 | Hsieh | |
| 8,755,218 B2* | 6/2014 | Lee et al. | 365/156 |
| 2001/0043487 A1* | 11/2001 | Nii | G11C 7/18 365/154 |
| 2006/0092702 A1 | 5/2006 | Lee | |
| 2010/0136784 A1* | 6/2010 | Mebarki | H01L 21/0337 438/669 |
| 2011/0044094 A1 | 2/2011 | Houston | |
| 2011/0075470 A1* | 3/2011 | Liaw | G11C 8/16 365/154 |
| 2011/0075504 A1* | 3/2011 | Chan et al. | 365/230.05 |
| 2013/0193398 A1 | 8/2013 | Pellizzer et al. | |
| 2014/0024220 A1* | 1/2014 | Chang | H01L 21/3065 438/710 |

OTHER PUBLICATIONS

Fujiwara H., et al., "A Dependable SRAM with 7T/14T Memory Cells", IEICE Transactions on Electronics, Institute of Electronics, Tokyo, JP, vol. E92C, No. 4, Apr. 2009 (Apr. 2009), pp. 423-432.
International Search Report and Written Opinion—PCT/US2015/041818—ISA/EPO—Jan. 18, 2016.

* cited by examiner

THREE-PORT BIT CELL HAVING INCREASED WIDTH

I. FIELD

The present disclosure is generally related to bit cells.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Electronic devices, such as wireless telephones, may include memories that include a memory array made of one or more memory cells. One type of memory cell that may be used for the memory (e.g., L1/L2 cache) is a 3-port bit cell. A 3-port bit cell may include two read ports and one write port, and may be used in static random access memory (SRAM) devices. In 14 nanometer (nm) complementary metal oxide semiconductor (CMOS) technology, a 3-port SRAM bit cell may be manufactured by a two-mask litho-etch-litho-etch (LELE) process using fin field effect transistors (FinFETs) and overlaying of two metal layers, referred to as M1 and M2 layers. The top metal layer, M2, may be patterned in a non-linear fashion and may include "jogs" (e.g., turns). For manufacturing processes less than 14 nm (e.g., 10 nm or 7 nm), self-aligned double patterning (SADP) may be preferable to LELE for forming M1 and M2, due to decreased cost and improved process control (e.g., more precise line width and line spacing control) provided by SADP as compared to LELE. However, SADP may not support non-linear patterns that include jogs. Thus, the 3-port bit cell design for 14 nm manufacturing may be incompatible with SADP.

Scaling down from 14 nm technology may also present other challenges. For example, for technology nodes 14 nm and larger, the width of a 3-port bit cell may be restricted to being less than or equal to twice contacted poly pitch (CPP, the distance between contacted poly (gate) lines). For 14 nm, CPP may be approximately 80-90 nm. As used herein, cell "width" may be perpendicular to a poly direction and along a fin direction. For technology nodes smaller than 14 nm, CPP is reduced, which results in decreased bit cell width. When the bit cell width is reduced (i.e., narrowed), write and read word lines in the bit cell may also be narrowed, resulting in increased read/write latency due to increased word line resistor-capacitor (RC) resistance. In addition, the smaller bit cell size may result in a decrease in spacing between metal-metal vias of the bit cell. As via-to-via spacing decreases, it may become more difficult to pattern the vias using LELE (i.e., two masks). As a result, a third mask (i.e., LELELE) may be used, which may increase manufacturing cost of the bit cell.

III. SUMMARY

The present disclosure provides bit cell designs that include linear patterns and are therefore compatible with SADP, such as for technology nodes smaller than 14 nm (e.g., 10 nm or 7 nm). According to a first technique, a 3-port bit cell may have a width that is greater than twice the CPP. The increase in bit cell width may enable wider word lines in the bit cell, which may decrease read/write latency by decreasing word line RC resistance. Increasing the bit cell width may also increase spacing between metal-metal vias to a distance large enough to be compatible with two-mask LELE processes. Thus, increasing bit cell width to greater than twice the CPP may also enable metal-metal vias to be patterned without introducing an additional mask process.

According to a second technique, a 3-port bit cell may include two storage latches that are coupled to each other, where one side of the latches is shorted. Coupling two latches together may increase an overall width of the bit cell from 2*CPP to 4*CPP, which may enable benefits as described with reference to the first technique (e.g., linear patterns compatible with SADP, wider word lines, increased metal-metal via spacing, etc.). Moreover, because two latches are included in each bit cell, each bit cell may have built-in data redundancy.

According to a third technique, a 3-port bit cell may be formed as described with reference to the second technique. In addition, both read ports of the 3-port bit cell may be on the same side of the bit cell instead of on opposite sides of the bit cell. Having both read ports on the same side of the bit cell may decrease a length of the bit cell, resulting in less overall area than occupied by the bit cell of the first technique or the second technique.

In a particular embodiment, an apparatus includes a first read port, a second read port, a write port, and at least one storage latch. A width of a bit cell that includes the first read port, the second read port, and the write port is greater than twice a contacted poly pitch (CPP) associated with the bit cell.

In another particular embodiment, a bit cell includes a first read port, a second read port, a write port, a first storage latch, and a second storage latch. A first side of the first storage latch is connected to the first side of the second storage latch by a shorting connection.

In another particular embodiment, a bit cell includes a first read port, a second read port, a write port, a first storage latch, and a second storage latch. The first read port and the second read port are on a same side of the first storage latch and the second storage latch.

In another particular embodiment, a bit cell includes first means for reading data, second means for reading data, and means for writing data. The bit cell also includes first means for storing data and second means for storing data. A first side of the first means for storing data is connected to the first side of the second means for storing data by a shorting connection.

In another particular embodiment, a method includes patterning a first metal layer of a bit cell by a self-aligned double patterning (SADP) process. The bit cell includes a first read port, a second read port, and a write port. The method also includes patterning a second layer of the bit cell by the SADP process. A width of the bit cell is greater than twice a CPP associated with the bit cell.

In another particular embodiment, a non-transitory computer-readable medium includes instructions that, when executed by a computer, cause the computer to perform operations including patterning a first metal layer of a bit cell by a SADP process. The bit cell includes a first read port, a second read port, and a write port. The operations also include patterning a second layer of the bit cell by the SADP process. A width of the bit cell is greater than twice a CPP associated with the bit cell.

One particular advantage provided by at least one of the disclosed embodiments is a 3-port bit cell that has increased width (e.g., greater than twice CPP), free of non-linear patterns, and compatible with SADP semiconductor manufacturing processes at less than 14 nm (e.g., 10 nm or 7 nm). Another particular advantage is built-in data redundancy in a three-port bit cell including a pair of storage latches, where one side of each of the storage latches is shorted by a shorting connection.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of the present disclosure are described below with reference to the drawings. In the description and the drawings, common features are designated by common reference numbers for clarity of the embodiments as depicted and described.

Figure 1A:
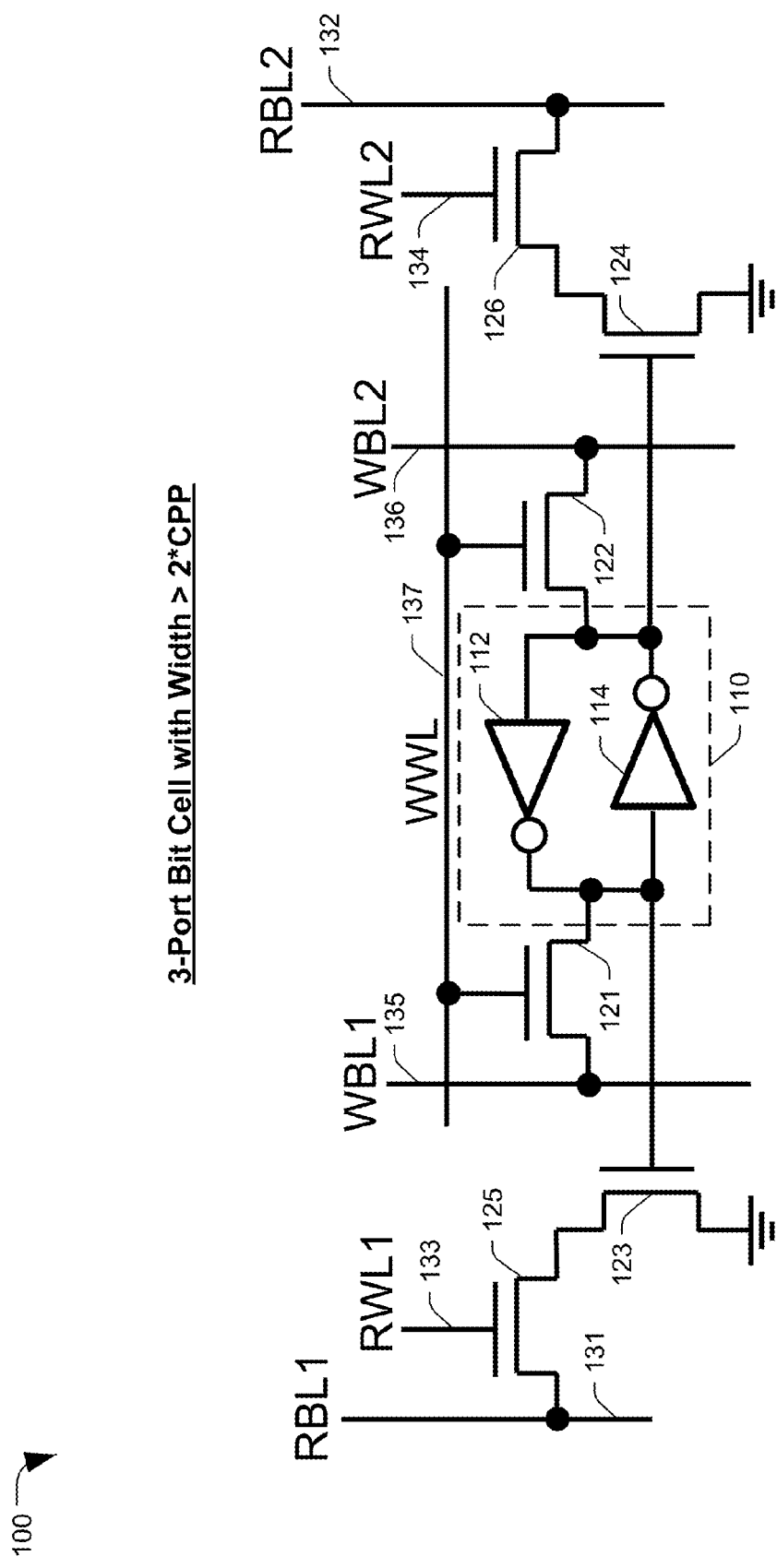
FIG. 1A and FIG. 1B are circuit diagrams of a first illustrative embodiment of a 3-port bit cell.
Figure 1B:
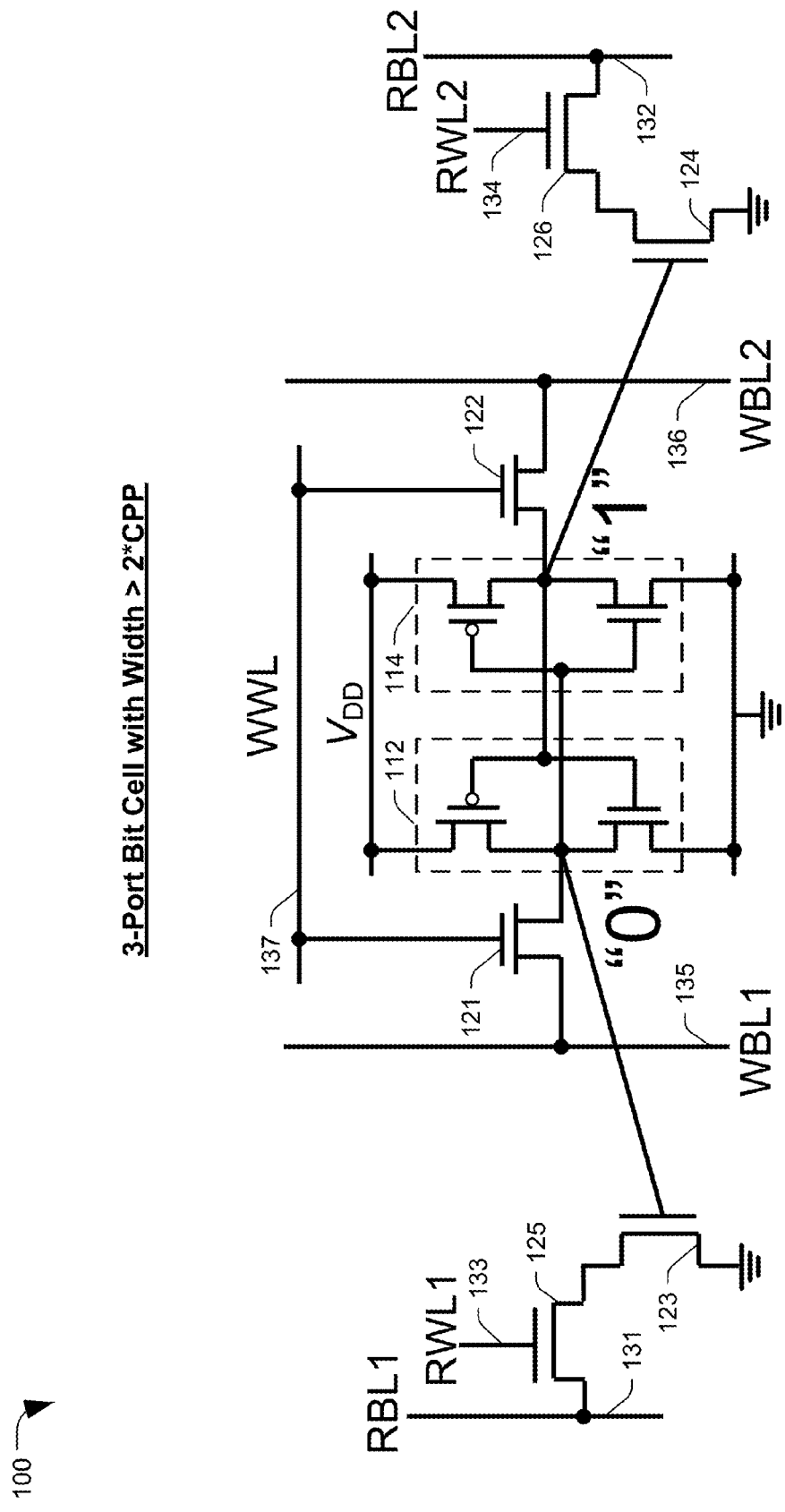

Referring to FIGS. 1A and 1B, circuit diagrams of a first illustrative embodiment of a bit cell 100 are shown. The bit cell 100 includes a storage latch 110. The storage latch 110 may include a pair of cross-coupled inverters 112, 114. Each of the inverters 112, 114 may include a p-type metal oxide semiconductor (MOS) field effect transistor (PFET) and an n-type MOS FET (NFET), as shown in FIG. 1B.

The storage latch 110 may be connected (e.g., coupled) to a first write transistor 121 and to a second write transistor 122. The write transistors 121, 122 may be NFETs, as shown. The first write transistor 121 may be connected to a first write bit line (WBL1) 135 and to a write word line (WWL) 137, and the second write transistor 122 may be connected to a second write bit line (WBL2) 136 and to the write word line (WWL) 137. The first write transistor 121 and the second write transistor 122 may be complementary write transistors of a write port of the bit cell 100. The write port may be used to write a logic zero (e.g., low) value into the storage latch 110 when the write word line 137 and one of the write bit lines 135 or 136 are asserted. The write port may be used to write a logic one (e.g., high) value into the storage latch 110 when the write word line 137 and the other of the write bit lines 135 or 136 are asserted.

The storage latch 110 may also be connected to a first read drive transistor 123 and to a second read drive transistor 124. The first read drive transistor 123 may be connected to a first read transistor 125 and the second read drive transistor 124 may be connected to a second read transistor 126. The read drive transistors 123, 124 and the read transistors 125, 126 may be NFETs, as shown. The first read transistor 125 may be connected to a first read bit line (RBL1) 131 and to a first read word line (RWL1) 133. The second read transistor 126 may be connected to a second read bit line (RBL2) 132 and to a second read word line (RWL2) 134. The transistors 123 and 125 may correspond to a first read port of the bit cell 100, and the transistors 124 and 126 may correspond to a second read port of the bit cell 100. The read word lines 133 and/or 134 may be asserted during a read operation and the read ports may be complementary read ports. For example, when a data value at the first read port is logic zero, a data value at the second read port is logic one, and vice versa. In the example of FIG. 1B, the first read port (on the left) is shown as reading a logic zero value ("0") and the second read port (on the right) is shown as reading a logic one ("1") value.

The bit cell 100 may thus include two read ports and one write port, and may alternatively be referred to as a "3-port" bit cell. Because the bit cell 100 includes ten transistors, the bit cell 100 may also be referred to as a "10T" bit cell. In a particular embodiment, the bit cell 100 is included in a static random access memory (SRAM) device and provides high-speed parallel memory access. As an illustrative non-limiting example, an SRAM device that includes the bit cell 100 may be used in an L1 and/or L2 cache of a processor. The SRAM device may include one or more arrays of bit cells arranged in a grid-like fashion, including one or more rows of bit cells and one or more columns of bit cells.

As further described herein, the bit cell 100 may have a height (H) and a width (W). In accordance with the described techniques, the width (W) may be greater than twice a contacted poly pitch (CPP) associated with the bit cell 100, where CPP corresponds to a distance between contacted poly (gate) lines. CPP may alternately be referred to as gate pitch. For example, in a 10 nm semiconductor manufacturing process (e.g., a process that has a smallest available line distance/feature size of 10 nm), CPP may be approximately equal to 60-66 nm. For comparative purposes, CPP for a 14 nm process (e.g., a process that has a smallest available line distance/feature size of 14 nm) may be approximately 80-90 nm. In existing techniques, bit cell width may be restricted to being less than or equal to 2*CPP. In contrast, the techniques of the present disclosure increase the width of the bit cell 100 to larger than 2*CPP, thereby enabling wider read and write word lines. As further described with reference to FIG. 2, wider word lines may provide reduced read/write latency for the bit cell 100. Increasing the width of the bit cell 100 to exceed 2*CPP may also enable spacing between metal-metal vias to increase to an amount that is compatible with a two-mask litho-etchlitho-etch (LELE) process, as further described with reference to FIG. 3. Two-mask LELE may be cheaper than three mask LELELE, which may be required when the width of the bit cell 100 is less than or equal 2*CPP for processes less than 14 nm. Examples of processes less than 14 nm may include, but are not limited to, 10 nm processes and 7 nm processes.

Figure 2:
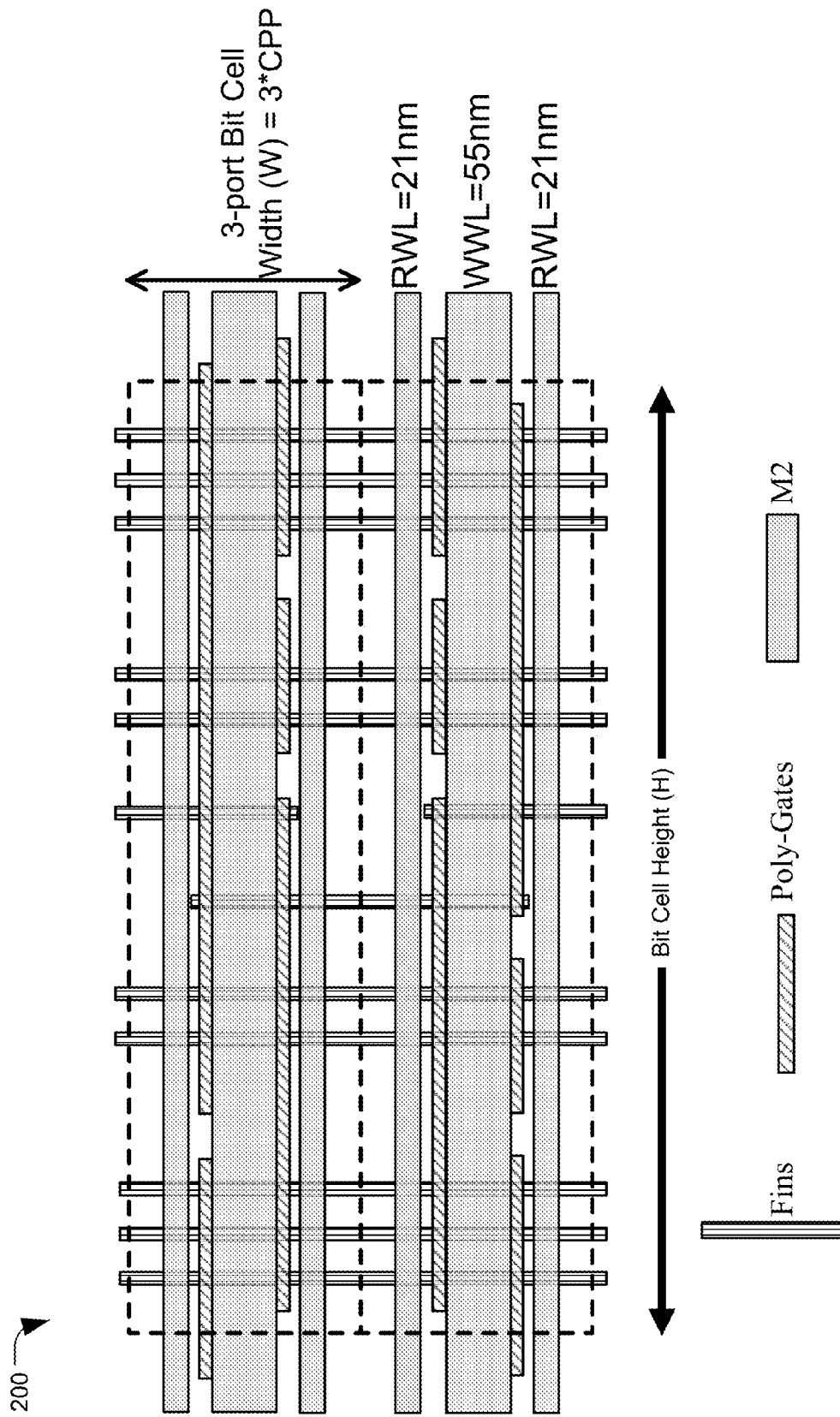
FIG. 2 is a first layout diagram of the 3-port bit cell of FIG. 1.
Figure 3:
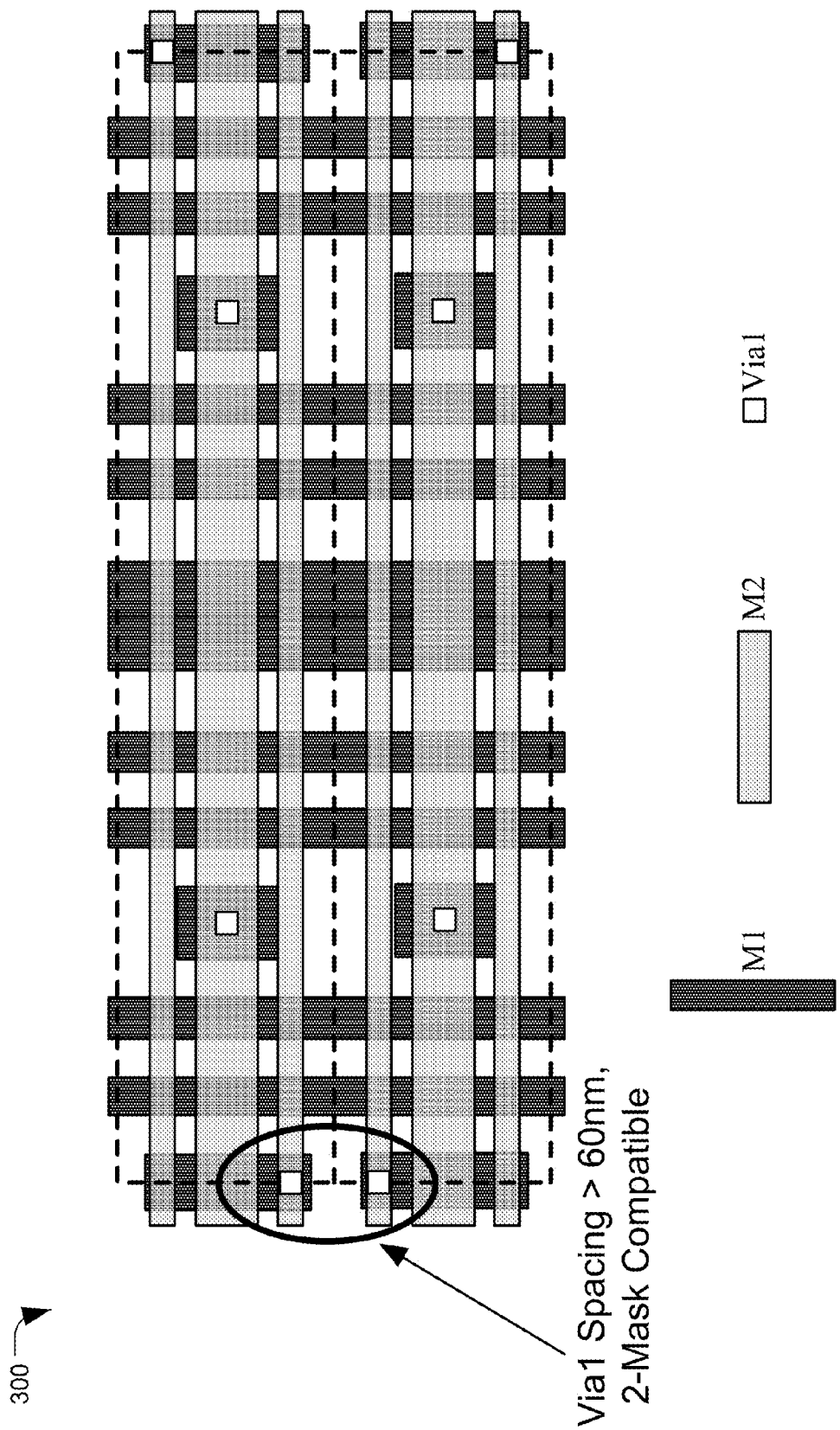
FIG. 3 is a second layout diagram of the 3-port bit cell of FIG. 1.

Referring to FIG. 2, a first layout diagram of the bit cell 100 is shown and is generally designated 200. FIG. 3 depicts a second layout diagram of the bit cell 100 and is generally designated 300. FIGS. 2 and 3 depict a column of two bit cells, where each bit cell has the circuit layout shown in FIGS. 1A and 1B. When manufactured, the bit cell 100 may include various components/layers, such as fins (FinFETs including source/drain regions), transistor gates (alternately referred to as poly lines), middle-of-line contacts (e.g., local interconnects) for transistor source/drain regions (MD), middle-of-line contacts (e.g., local interconnects) for gates/poly lines (MP), a first metal layer (M1), vias connecting MD and MP to M1 (Via0), a second metal layer (M2), and vias connecting M1 to M2 (Via1). FIG. 2 illustrates fins, poly lines, and M2. Thus, in FIG. 2, CPP is the distance from an edge of a poly line to a corresponding edge of an adjacent poly line (e.g., top-edge to top-edge or bottom-edge to bottom-edge). CPP may therefore also be considered as being equal to a sum of one poly width and one poly spacing.

As described with reference to FIG. 1, when migrating from a 14 nm process to a 10 nm process, SADP may be preferable for patterning metal layers of the bit cell 100. Because SADP may be ill-suited for jogs/turns, the metal layers of the bit cell 100 may correspond to linear-only patterns. When using linear-only patterns at 10 nm, aggressive CPP scaling while maintaining three independently accessible word lines (2 read word lines and 1 write word line) may decrease word line width. As an illustrative non-limiting example, the write word line 137 of FIG. 1 may be approximately 60-70 nm width in the 14 nm case and may be approximately 27 nm wide in the 10 nm case if width of the bit cell were fixed at 2*CPP. Reduced width of the word lines may increase resistor-capacitor (RC) resistance of the word lines, resulting in increased latency. In FIG. 2, bit cell width, which is perpendicular to a poly direction and along a fin direction, is vertical. Bit cell height, which is parallel to the poly direction and perpendicular to the fin direction, is horizontal.

When migrating to processes smaller than 14 nm, the described techniques increase the width of the bit cell 100 to more than 2*CPP. Thus, the width of the write word line 137 and/or the read word lines 133, 134 may be increased. For example, in FIG. 2, bit cell width is increased to approximately three times CPP and the width of the write word line is approximately doubled to 55 nm. The increase in write word line width decreases RC resistance of the write word line, thereby decreasing write latency and providing improved performance. It should be noted that the amount of increase in write word line width and in read word line width may vary based on a desired balance of read vs. write latency. For example, in read-critical applications, read word line widths may be increased more than write word line width. For write-critical applications, write word line width may be increased more than read word line widths. For read-critical and write-critical applications, relative increases in read and write word line widths may be determined based on design requirements.

It is also noted that by increasing bit cell width to 3*CPP, the 10 nm bit cells shown in FIG. 2 have approximately the same width (3*CPP=3*60=180 nm) as non-SADP 14 nm bit cells (2*CPP=2*90=180 nm). However, because the change from 14 nm to 10 nm may also decrease fin pitch (e.g., from 40-50 nm to 30-35 nm), an overall area occupied by the bit cell 100 may be decreased. The decrease in bit cell area may provide an ability to manufacture smaller memory devices, which may be especially desirable in the case of on-chip memory that is included in or tightly coupled to a processor. To illustrate, in a particular embodiment, an area occupied by the bit cell 100 at 10 nm may be approximately 0.130 square micrometers ($\mu m^2$), as compared to an area of 0.186 $\mu m^2$ for a non-SADP 14 nm 3-port bit cell.

It should be noted that the example of increasing bit cell width to approximately 3*CPP is not to be considered limiting. In alternate embodiments, bit cell width may be increased to another amount greater than 2*CPP (e.g., 2.5*CPP, 2.75*CPP, 4*CPP, etc.).

Although SADP may be preferred for patterning metal layers of the bit cell 100 in technologies less than 14 nm, LELE may be preferred (e.g., for cost-related and/or process-related reasons) for forming vias that connect the metal layers. However, migrating to processes smaller than 14 nm may decrease the spacing between metal-metal vias in the bit cell 100, such as vias that connect the M1 layer to the M2 layer (Via1). In particular, spacing between such vias may be decreased to less than 40 nm when bit cell width is fixed at 2*CPP. This reduction in via spacing may prevent two-color decomposition of the vias. That is, a two-mask LELE process may not have sufficient process control or precision to form the vias. As a result, a three-mask LELELE process may be required to pattern the metal-metal vias. The addition of another mask may add significant manufacturing cost to the bit cell. By increasing the width of the bit cell 100 to greater than 2*CPP, the spacing between metal-metal vias may be increased to an amount that is compatible with a two-mask LELE process. For example, when width of the bit cell 100 is increased to 3*CPP, the spacing between metal-metal vias may be greater than 60 nm, as shown in FIG. 3, which illustrates the M1, M2, and Via1 layers. Thus, increasing width of the bit cell 100 to greater than 2*CPP may also reduce manufacturing cost associated with the bit cell 100.

The bit cell 100 described with reference to FIGS. 1-3 may thus be compatible with SADP metal patterning for manufacturing processes less than 14 nm (e.g., 10 nm or 7 nm). In addition, the bit cell 100 may have increased read and/or write word line width, which may reduce read and/or write latency. Further, the bit cell 100 may provide increased spacing between metal-metal vias and may be compatible with a two-mask LELE process for via formation, which may reduce manufacturing cost as compared to a 3-mask LELELE process for via formation.

Figure 4A:
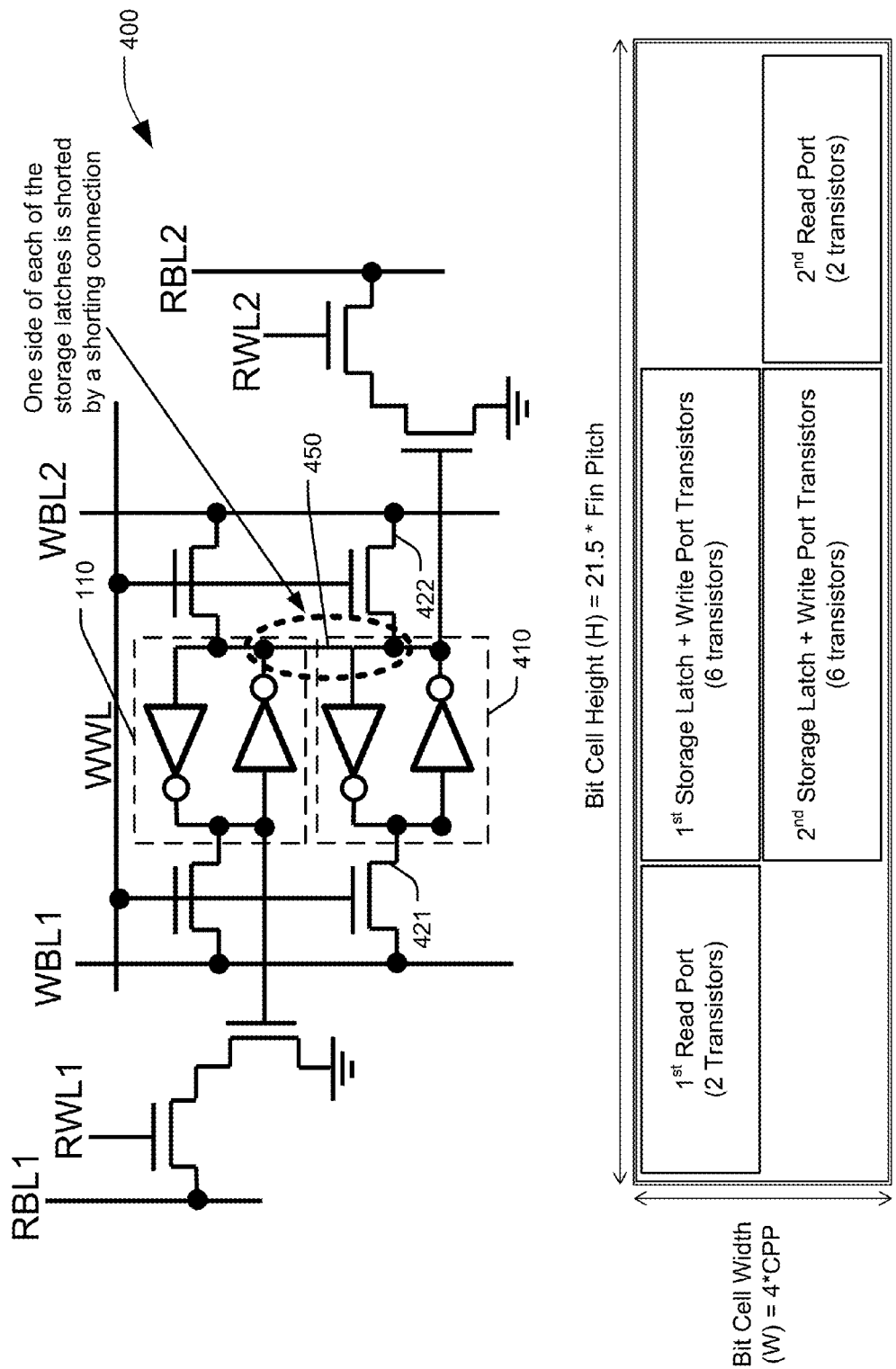
FIG. 4A and FIG. 4B are circuit diagrams of a second illustrative embodiment of a 3-port bit cell.
Figure 4B:
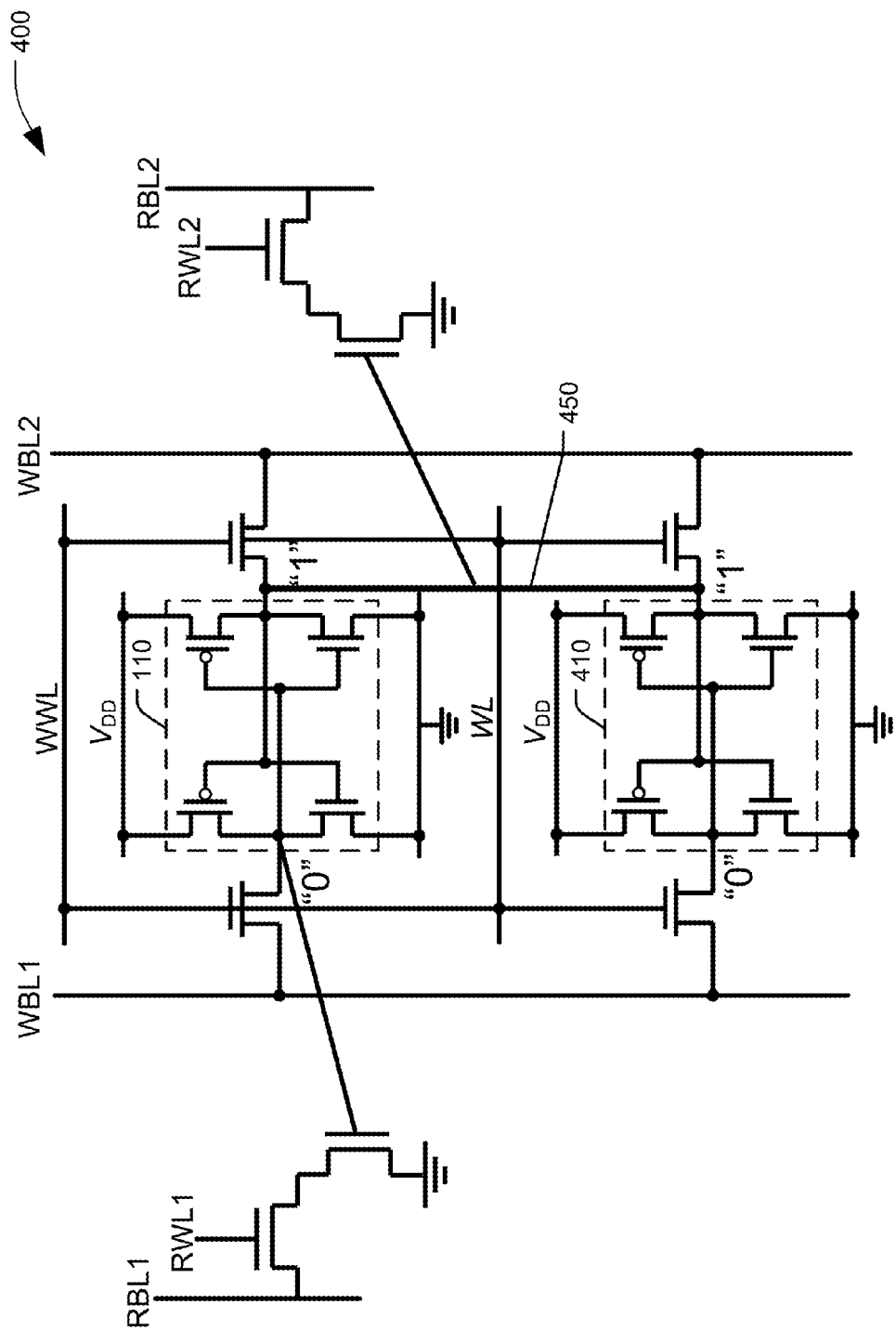

Referring to FIG. 4A and FIG. 4B, circuit diagrams of a second illustrative embodiment of a 3-port bit cell 400 are shown. The bit cell 400 includes the first storage latch 110 and also includes a second storage latch 410 and additional write transistors 421 and 422. A side of the first storage latch 110 is connected to the same side of the second storage latch 410 by a shorting connection 450. The first storage latch 110 is connected to the first read port and the second storage latch 410 is connected to the second read port, where the read ports are on opposite sides of the bit cell 400, as shown.

In a particular embodiment, as shown at the bottom of FIG. 4A, the bit cell 400 may have a width of 4*CPP, which is greater than 2*CPP. Thus, like the bit cell 100, the bit cell 400 may be compatible with SADP patterning for metal layers and 2-mask LELE patterning of metal-metal vias. The height of the bit cell 400 may be approximately 21.5 times fin pitch. For a 10 nm process, fin pitch may be 30-35 nm. In a particular embodiment, an area occupied by the bit cell 400 may be approximately 0.181 µm².

It is noted that the bit cell 400 provides complementary data reads. For example, as shown in FIG. 4B, when the first read port (on the left) reads a logic zero value, the second read port (on the right) reads a logic one value. In addition, by including two storage latches 110, 410 and shorting a side of the storage latches, the bit cell 400 has built-in data redundancy. For example, if a strong logic one value cannot be written into the left side of the first storage latch 110 (e.g., due to process variations), a strong logic one value may nonetheless be present on the left side of the second storage latch 410 due to the shorting/cross-coupling action.

Figure 5:
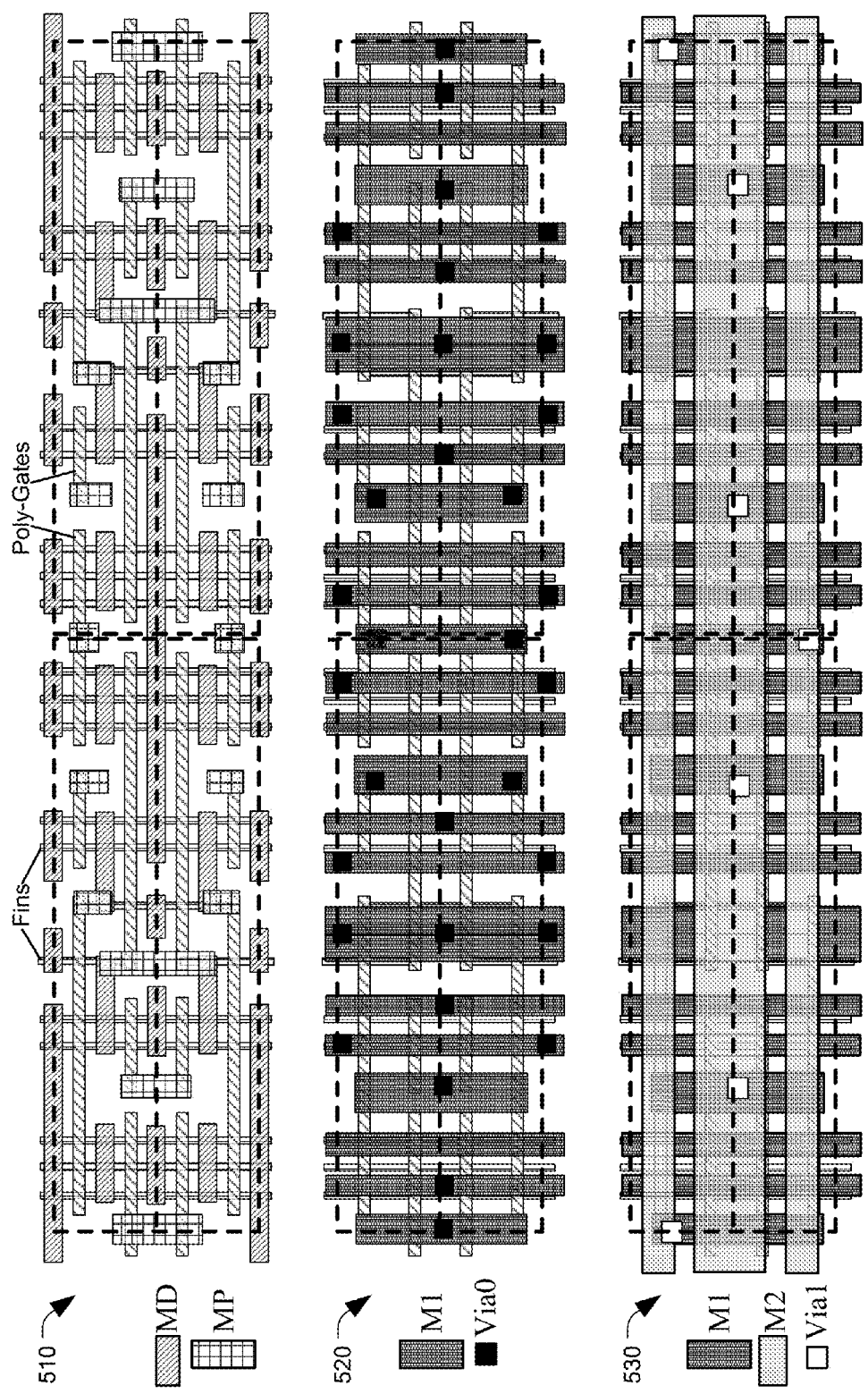
FIG. 5 depicts layout diagrams of the 3-port bit cell of FIG. 4.

Referring to FIG. 5, layout diagrams of a 2×2 array including four bit cells are shown, where each of the four bit cells has the circuit layout of the bit cell 400. As described with reference to FIGS. 2-3, a bit cell may include various components/layers, such as fins, poly-gates, MD, MP, M1, Via0, M2, and Via1. For clarity and ease of illustration, three layout diagrams 510, 520, and 530 are shown in FIG. 5 for the same 2×2 array. Each of the layout diagrams 510, 520, and 530 depicts fins (vertically patterned in FIG. 5) and poly-gates (horizontally patterned in FIG. 5). The first layout diagram 510 additionally depicts the MD (horizontally patterned) and MP (vertically patterned) layers, each of which is below the M1 layer. The second layout diagram 520 additionally depicts the M1 (vertically patterned) and Via0 (dark squares) layers. The third layout diagram 530 additionally depicts the M1 (vertically patterned), M2 (horizontally patterned), and Via1 (light squares) layers. In a particular embodiment, the shorting connection 450 may be patterned using the MD and/or MP layers.

The bit cell 400 described with reference to FIGS. 4-5 may thus be compatible with SADP metal patterning for manufacturing processes less than 14 nm (e.g., 10 nm or 7 nm), may provide reduced read and/or write latency, and may be compatible with two-mask LELE for via formation. The bit cell 400 may also provide built-in data redundancy, which may improve a tolerance of the bit cell 400 to process variations.

Figure 6A:
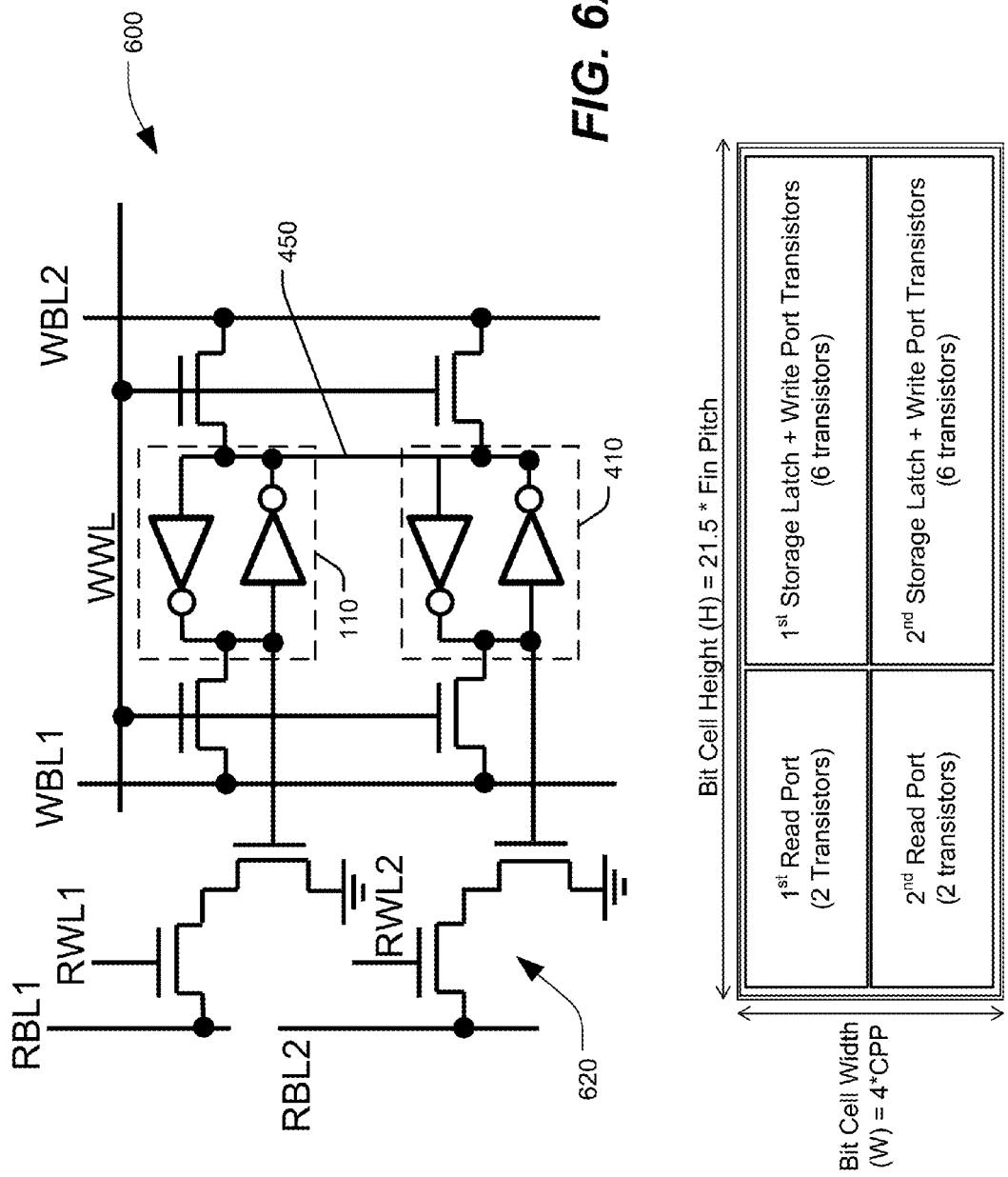
FIG. 6A and FIG. 6B are circuit diagrams of a third illustrative embodiment of a 3-port bit cell.
Figure 6B:
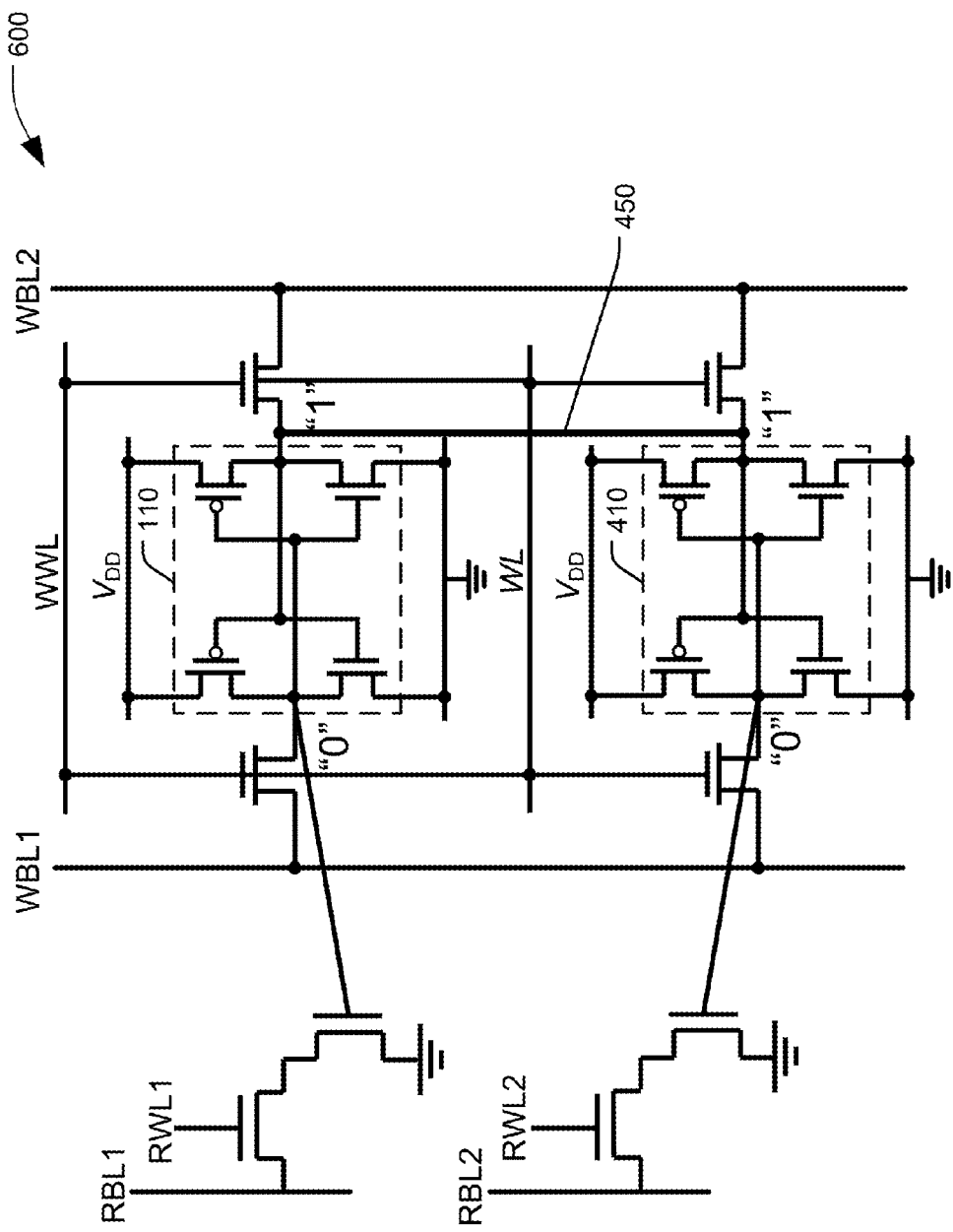

Referring to FIG. 6A and FIG. 6B, circuit diagrams of a third illustrative embodiment of a 3-port bit cell 600 are shown. Like the bit cell 400, the bit cell 600 includes the first storage latch 110 and the second storage latch 410, where a first (e.g., right) side of the first storage latch 110 is connected to the first (e.g., right) side of the second storage latch 410 by the shorting connection 450. In contrast to the bit cell 400, in the bit cell 600, the first read port and the second read port are on a second (e.g., left) side, as indicated at 620, which is opposite the first side.

In a particular embodiment, as shown at the bottom of FIG. 6A, the bit cell 600 may have a width of 4*CPP, which is greater than 2*CPP. Thus, like the bit cell 100 and the bit cell 400, the bit cell 600 may be compatible with SADP patterning for metal layers and 2-mask LELE patterning of metal-metal vias. The height of the bit cell 600 may be approximately 15.5 times fin pitch. For a 10 nm process, fin pitch may be 30-35 nm. In a particular embodiment, an area occupied by the bit cell 600 may be approximately 0.139 µm², which is less than the area of the bit cell 100 and less than the area of the bit cell 400 at 10 nm.

It is noted that unlike the bit cell 100 and the bit cell 400, the bit cell 600 does not provide complementary data reads. For example, as shown in FIG. 6B, when the first read port (on the left) reads a logic zero value, the second read port (on the right) also reads a logic zero value. Thus, a memory architecture (e.g., sense amplifiers, drivers, memory controllers, etc.) for a device that includes the bit cell 600 may differ from a memory architecture for a device that includes the bit cell 100 or the bit cell 400. In addition, like the bit cell 400, the bit cell 600 has built-in data redundancy.

Figure 7:
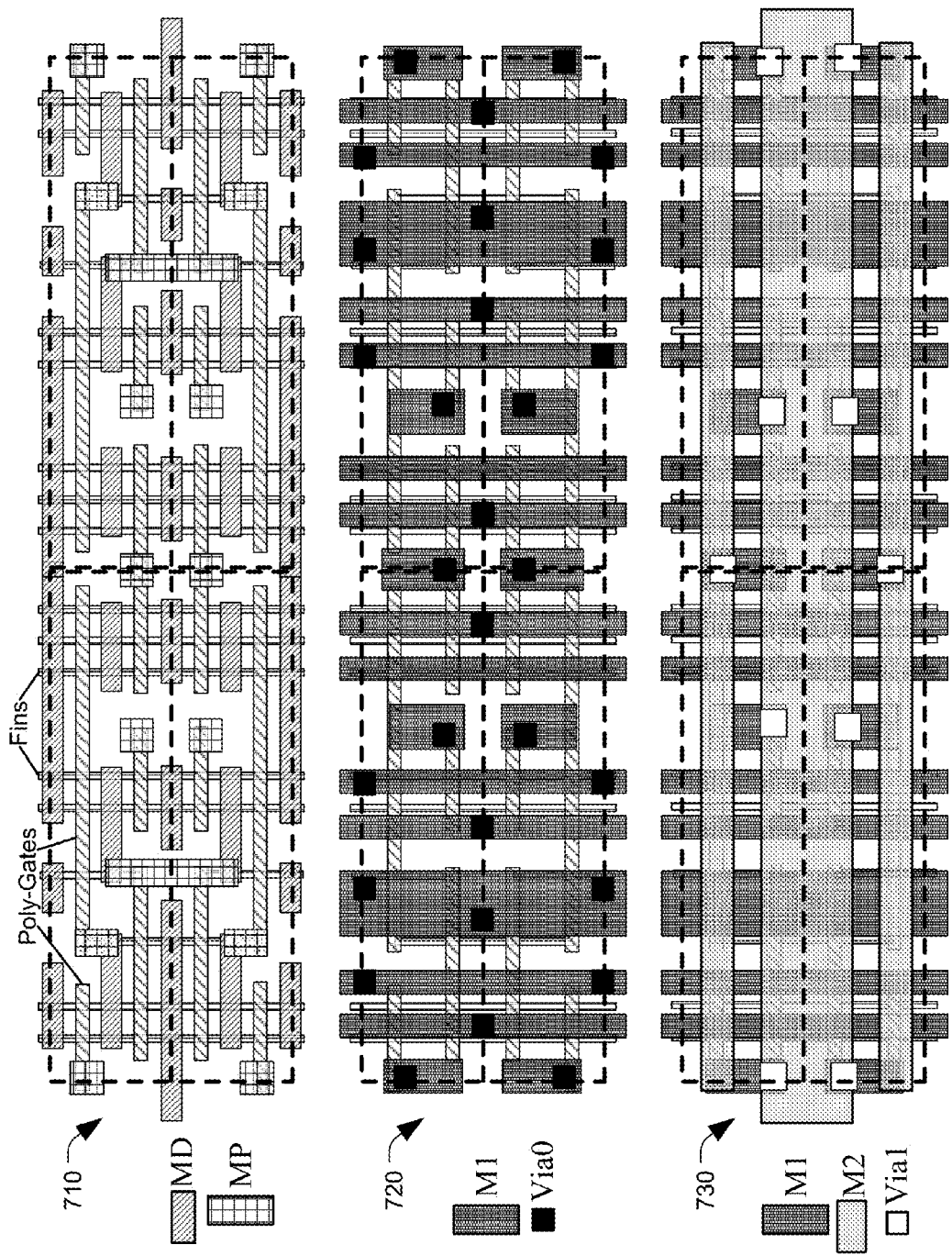
FIG. 7 depicts layout diagrams of the 3-port bit cell of FIG. 6.

Referring to FIG. 7, layout diagrams of a 2×2 array including four bit cells are shown, where each of the bit cells has the circuit of the bit cell 600. For clarity and ease of illustration, three layout diagrams 710, 720, and 730 are shown in FIG. 7 for the same 2×2 array. Each of the layout diagrams 710, 720, and 730 depicts fins (vertically patterned in FIG. 7) and poly-gates (horizontally patterned in FIG. 7). The first layout diagram 710 additionally depicts the MD (horizontally patterned) and MP (vertically patterned) layers, each of which is below the M1 layer. The second layout diagram 720 additionally depicts the M1 (vertically patterned) and Via0 (dark squares) layers. The third layout diagram 730 additionally depicts the M1 (vertically patterned), M2 (horizontally patterned), and Via1 (light squares) layers. In a particular embodiment, the shorting connection 450 may be patterned using the MD and/or MP layers.

The bit cell 600 may thus be compatible with SADP metal patterning for manufacturing processes less than 14 nm (e.g., 10 nm or 7 nm), may provide reduced read and/or write latency, and may be compatible with two-mask LELE for via formation. The bit cell 600 may also provide built-in data redundancy, which may improve a tolerance of the bit cell 600 to process variations. Moreover, the bit cell 600 may be smaller than the bit cell 100 and the bit cell 400, which may provide improved scaling when migrating to semiconductor manufacturing processes smaller than 14 nm.

Figure 8:
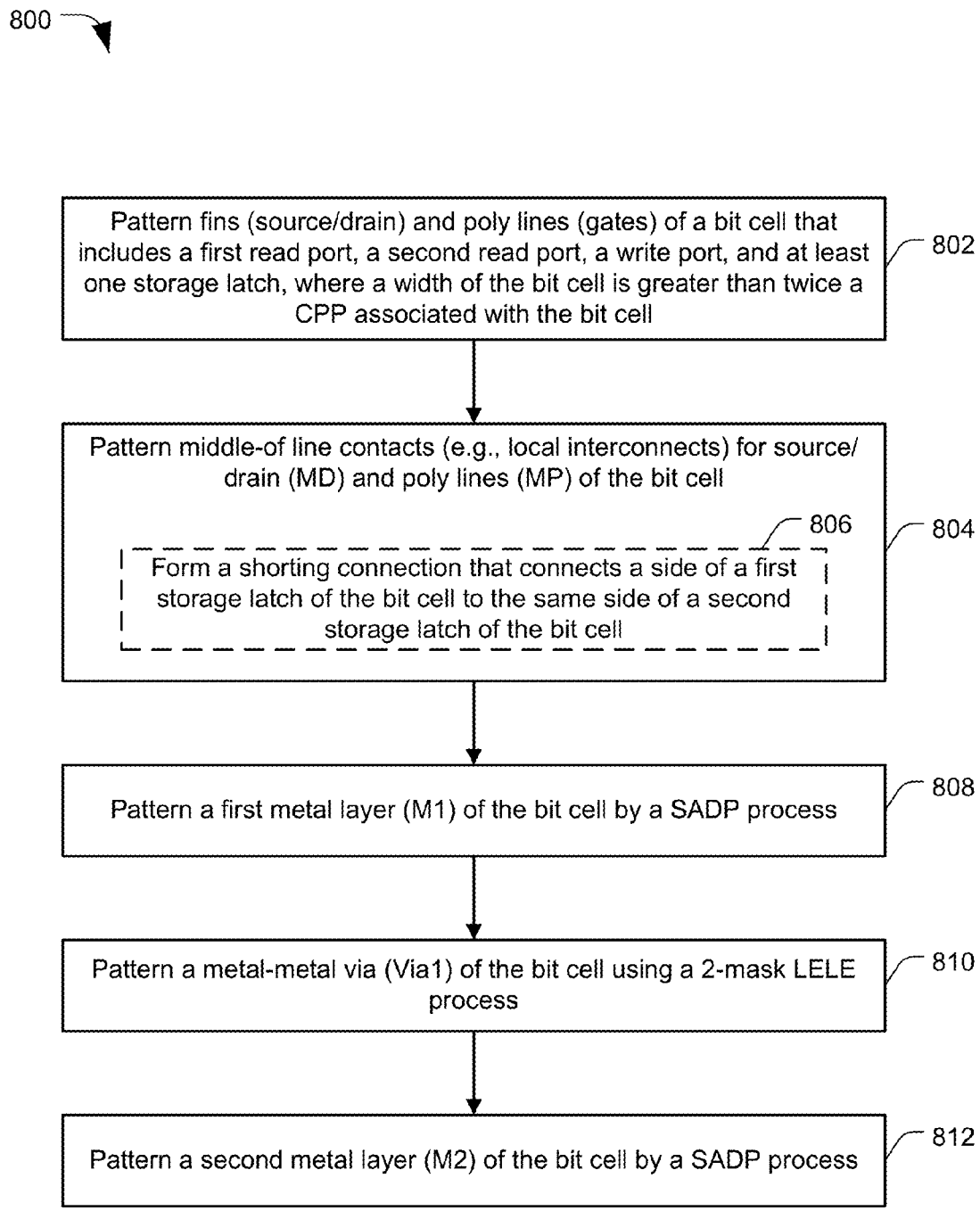
FIG. 8 is a flowchart of a particular illustrative embodiment of a method of forming a 3-port bit cell.

Referring to FIG. 8, a flowchart of a particular illustrative embodiment of a method 800 of forming a bit cell is shown and generally designated 800. In an illustrative embodiment, all or a portion of the method 800 may be performed during manufacturing of the bit cell 100, the bit cell 400, or the bit cell 600.

The method 800 may include patterning fins (source/drain regions) and poly lines (gates) of a bit cell, at 802. The bit cell may include a first read port, a second read port, a write port, and at least one storage latch. A width of the bit cell may be greater than twice a CPP associated with the bit cell. The method 800 may also include patterning middle-of-line contacts (e.g., local interconnects) for source/drain (e.g., MD layer) and poly lines (e.g., MP layer) of the bit cell, at 804. In a particular embodiment, patterning the middle-of-line contacts may include forming a shorting connection, at 806. The shorting connection may connect a side of a first storage latch of the bit cell to the same side of a second storage latch of the bit cell. For example, when the bit cell is the bit cell 400 or the bit cell 600, the shorting connection 450 may be formed in the MD and/or MP layer. However, when the bit cell is the bit cell 100, the shorting connection may not be formed (i.e., the method step 806 may not be performed).

The method 800 may further including patterning a first metal layer (M1) of the bit cell by a SADP process, at 808, patterning a metal-metal via (Via1) of the bit cell using a 2-mask LELE process, at 810, and patterning a second metal layer (M2) of the bit cell by a SADP process, at 812. For example, the M1 and M2 layer may each be free of non-linear patterns and may thus be compatible with SADP, as described with reference to FIG. 2. Further, spacing between metal-metal vias (Via1) may be compatible with the 2-mask LELE process, as described with reference to FIG. 3.

Increased bit cell width may also make Via0 spacing compatible with the 2-mask LELE process.

It should be noted that the order of steps illustrated in FIG. 8 is for illustrative purposes only, and is not to be considered limiting. In alternative embodiments, certain steps may be performed in a different order and/or may be performed concurrently (or at least partially concurrently).

The method 800 may be implemented by a processing unit such as a central processing unit (CPU), a controller, another hardware device, firmware device, or any combination thereof. As an example, the method 800 can be performed by a processor that executes instructions, as described with respect to FIG. 10.

Figure 9:
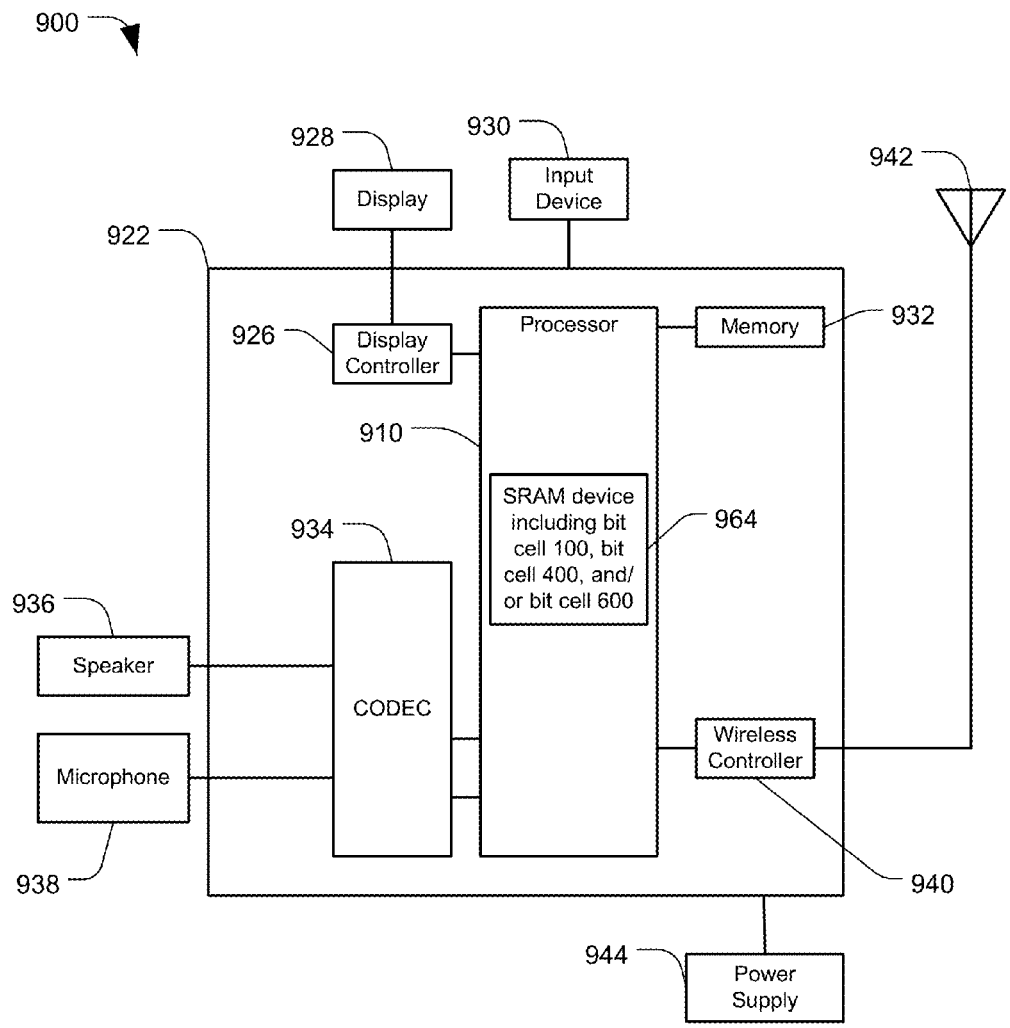
FIG. 9 is a block diagram of an electronic device including the 3-port bit cell of FIG. 1, FIG. 4, and/or FIG. 6.

Referring to FIG. 9, a block diagram of a particular illustrative embodiment of an electronic device is depicted and generally designated 900. The electronic device 900 includes a processor 910, such as a digital signal processor (DSP) or a central processing unit (CPU), coupled to a memory 932. The processor 910 includes an SRAM device 964, where the SRAM device includes the bit cell 100, the bit cell 400, and/or the bit cell 600. For example, the SRAM device 964 may correspond to L1 and/or L2 cache memory. In an illustrative embodiment, the bit cells of the SRAM device 964 may be manufactured according to all or a portion of the method 800 of FIG. 8. In an alternative embodiment, the SRAM device 964 may be external to and/or coupled to the processor 910. It should be noted that although FIG. 9 illustrates use of the bit cell 100, the bit cell 400, and/or the bit cell 600 in SRAM of a particular electronic device, this is not to be considered limiting. Bit cells in accordance with the present disclosure, such as the bit cell 100, the bit cell 400, and/or the bit cell 600, may be included in any type of memory of any type of electronic device.

FIG. 9 shows a display controller 926 that is coupled to the processor 910 and to a display 928. A coder/decoder (CODEC) 934 can also be coupled to the processor 910. A speaker 936 and a microphone 938 can be coupled to the CODEC 934. FIG. 9 also indicates that a wireless controller 940 can be coupled to the processor 910 and to an antenna 942. In a particular embodiment, the processor 910, the display controller 926, the memory 932, the CODEC 934, and the wireless controller 940 are included in a system-in-package or system-on-chip device (e.g., mobile station modem (MSM)) 922. In a particular embodiment, an input device 930 and a power supply 944 are coupled to the system-on-chip device 922. Moreover, in a particular embodiment, as illustrated in FIG. 9, the display 928, the input device 930, the speaker 936, the microphone 938, the antenna 942, and the power supply 944 are external to the system-on-chip device 922. However, each of the display 928, the input device 930, the speaker 936, the microphone 938, the antenna 942, and the power supply 944 can be coupled to a component of the system-on-chip device 922, such as an interface or a controller.

In conjunction with the described embodiments, a bit cell includes first means for reading data, second means for reading data, means for writing data, and at least one means for storing data. For example, the first means for reading data may include a first read port (e.g., including the transistor 123, the transistor 125, the first read bit line 131, and/or the first read word line 133), one or more other devices configured to support a read operation in a bit cell, or any combination thereof. The second means for reading data may include a second read port (e.g., including the transistor 124, the transistor 126, the second read bit line 132, and/or the second read word line 134), one or more other devices configured to support a read operation on a bit cell, or any combination thereof. The means for writing data may include a write port (e.g., including the transistor 121, the transistor 122, the transistor 421, the transistor 422, the write word line 137), one or more other devices configured to support a write operation in a bit cell, or any combination thereof. The at least one means for storing data may include the storage latch 110, the storage latch 410, one or more other devices configured to store data, or any combination thereof. In a particular embodiment, a width of the bit cell is greater than twice a contacted poly pitch (CPP) associated with the bit cell. In a particular embodiment, a first side of first means for storing data is connected to the first (i.e., same) side of second means for storing data by a shorting connection. For example, the shorting connection may be the shorting connection 450 of FIG. 4 or FIG. 6. In a particular embodiment, the first means for reading data and the second means for reading data are on the same side of the at least one means for storing data. For example, as shown in FIG. 6, the two read ports may be on the same side of the bit cell 600. In an alternative embodiment, the first means for reading data and the second means for reading data are on opposite sides of the at least one means for storing data. For example, as shown in FIG. 1 and FIG. 4, the two read ports may be on opposite sides of the bit cell 100 and the bit cell 400.

Figure 10:
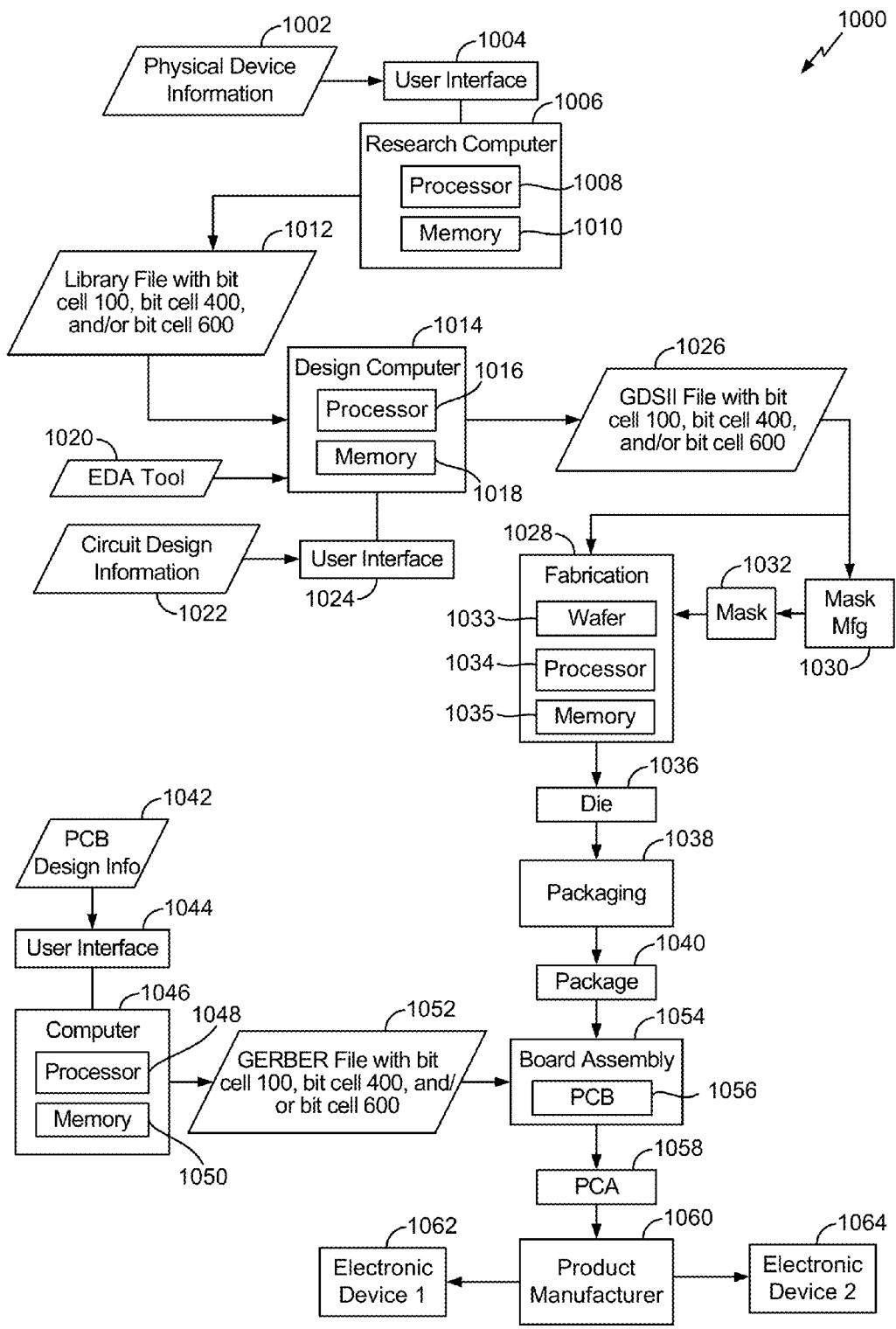
FIG. 10 is a data flow diagram of a particular illustrative embodiment of a manufacturing process to manufacture electronic devices that include the 3-port bit cell of FIG. 1, FIG. 4, and/or FIG. 6.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips may be employed in electronic devices. FIG. 10 depicts a particular illustrative embodiment of an electronic device manufacturing process 1000. For example, the manufacturing process 1000 may be used to manufacture electronic devices that include the bit cell 100, the bit cell 400, and/or the bit cell 600.

Physical device information 1002 is received at the manufacturing process 1000, such as at a research computer 1006. The physical device information 1002 may include design information representing at least one physical property of the bit cell 100, the bit cell 400, and/or the bit cell 600. For example, the physical device information 1002 may include physical parameters, material characteristics, and structure information that is entered via a user interface 1004 coupled to the research computer 1006. The research computer 1006 includes a processor 1008, such as one or more processing cores, coupled to a computer-readable medium (e.g., a non-transitory computer-readable medium), such as a memory 1010. The memory 1010 may store computer-readable instructions that are executable to cause the processor 1008 to transform the physical device information 1002 to comply with a file format and to generate a library file 1012.

In a particular embodiment, the library file 1012 includes at least one data file including the transformed design information. For example, the library file 1012 may include a library of bit cells including the bit cell 100, the bit cell 400, and/or the bit cell 600, that is provided for use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor executable instructions at the memory 1018 to enable a user of the design computer 1014 to design a circuit including the bit cell 100, the bit cell 400, and/or the bit cell 600, of the library file 1012. For example, a user of the design computer 1014 may enter circuit design information 1022 via a user interface 1024 coupled to the design computer 1014. The circuit design information 1022 may include design information representing at least one physical property of the bit cell 100, the bit cell 400, and/or the bit cell 600. To illustrate, the circuit design property may include identification of particular circuits and relationships to other elements in a circuit design, positioning information, feature size information, interconnection information, or other information representing a physical property of the bit cell 100, the bit cell 400, and/or the bit cell 600.

The design computer 1014 may be configured to transform the design information, including the circuit design information 1022, to comply with a file format. To illustrate, the file format may include a database binary file format representing planar geometric shapes, text labels, and other information about a circuit layout in a hierarchical format, such as a Graphic Data System (GDSII) file format. The design computer 1014 may be configured to generate a data file including the transformed design information, such as a GDSII file 1026 that includes information describing the bit cell 100, the bit cell 400, and/or the bit cell 600, in addition to other circuits or information. To illustrate, the data file may include information corresponding to a system-on-chip (SOC) that includes the bit cell 100, the bit cell 400, and/or the bit cell 600, and that also includes additional electronic circuits and components within the SOC.

The GDSII file 1026 may be received at a fabrication process 1028 to manufacture the bit cell 100, the bit cell 400, and/or the bit cell 600, according to transformed information in the GDSII file 1026. For example, a device manufacture process may include providing the GDSII file 1026 to a mask manufacturer 1030 to create one or more masks, such as masks to be used with photolithography processing, illustrated as a representative mask 1032. The mask 1032 may be used during the fabrication process to generate one or more wafers 1033, which may be tested and separated into dies, such as a representative die 1036. The die 1036 includes a circuit including a device that includes the bit cell 100, the bit cell 400, and/or the bit cell 600.

For example, the fabrication process 1028 may include a processor 1034 and a memory 1035 to initiate and/or control the fabrication process 1028. The memory 1035 may include executable instructions such as computer-readable instructions or processor-readable instructions. The executable instructions may include one or more instructions that are executable by a computer such as the processor 1034. In a particular embodiment, the executable instructions may cause a computer to perform the method 800 of FIG. 8 or at least a portion thereof.

The fabrication process 1028 may be implemented by a fabrication system that is fully automated or partially automated. For example, the fabrication process 1028 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular embodiment, the fabrication process 1028 corresponds to a semiconductor manufacturing process associated with a technology node smaller than 14 nm (e.g., 10 nm, 7 nm, etc.). The specific process or combination of processes used to manufacture a device (e.g., including the bit cell 100, the bit cell 400, and/or the bit cell 600) may be based on design constraints and available materials/equipment. Thus, in particular embodiments, different processes may be used than described with reference to FIGS. 1-10 during manufacture of the device.

As an illustrative example, a two-mask LELE process used during Via1 formation for the bit cell 100, the bit cell 400, and/or the bit cell 600 may include using a first photoresist mask to form a first pattern on a first layer (e.g., a nitride layer) of a device and etching the first pattern. A second mask may then be used to form a second pattern on the device and the combined pattern may be etched down to a second, lower layer (e.g., an oxide layer) of the device. In the combined pattern, features (e.g., lines) of the first pattern and the second pattern may be interleaved. The combined pattern may thus have smaller feature (e.g., line) pitch as compared to the first pattern and the second pattern.

As another illustrative example, a SADP process used to pattern an M1 or M2 layer of the bit cell 100, the bit cell 400, and/or the bit cell 600 may include forming a "dummy" pattern on a device. A conforming dielectric layer may be formed (e.g., deposited) over the dummy pattern and may be etched. During etching, all of the dielectric layer except "spacers" of dielectric material adjacent to sidewalls of the dummy pattern may be removed. The dummy pattern may then be removed (e.g., without etching), leaving behind the spacers, which may form a pattern that has higher feature (e.g., line) density than the dummy pattern. The higher-density spacer pattern may be used to pattern the M1 or M2 layer.

The fabrication system (e.g., an automated system that performs the fabrication process 1028) may have a distributed architecture (e.g., a hierarchy). For example, the fabrication system may include one or more processors, such as the processor 1034, one or more memories, such as the memory 1035, and/or controllers that are distributed according to the distributed architecture. The distributed architecture may include a high-level processor that controls or initiates operations of one or more low-level systems. For example, a high-level portion of the fabrication process 1028 may include one or more processors, such as the processor 1034, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 1034.

Alternatively, the processor 1034 may be a part of a high-level system, subsystem, or component of the fabrication system. In another embodiment, the processor 1034 includes distributed processing at various levels and components of a fabrication system.

The executable instructions included in the memory 1035 may enable the processor 1034 to form (or initiate formation of) the bit cell 100, the bit cell 400, and/or the bit cell 600. In a particular embodiment, the memory 1035 is a non-transitory computer-readable medium storing computer-executable instructions that are executable by the processor 1034 to cause the processor 1034 to initiate formation of a device in accordance with at least a portion of the method of FIG. 8. For example, the computer executable instructions may be executable to cause the processor 1034 to initiate formation of the bit cell 100, the bit cell 400, and/or the bit cell 600. As an illustrative example, the processor 1034 may initiate or control one or more of the steps of the method 800 of FIG. 8.

The die 1036 may be provided to a packaging process 1038 where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores, coupled to a memory 1050. A printed circuit board (PCB) tool may be stored as processor executable instructions at the memory 1050 to process PCB design information 1042 received from a user of the computer 1046 via a user interface 1044. The PCB design information 1042 may include physical positioning information of a packaged semiconductor device on a circuit board, the packaged semiconductor device corresponding to the package 1040 including the bit cell 100, the bit cell 400, and/or the bit cell 600.

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including the bit cell 100, the bit cell 400, and/or the bit cell 600. In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines to perform various steps of a PCB production process. The PCB 1056 may be populated with electronic components including the package 1040 to form a representative printed circuit assembly (PCA) 1058.

The PCA 1058 may be received at a product manufacture process 1060 and integrated into one or more electronic devices, such as a first representative electronic device 1062 and a second representative electronic device 1064. For example, the first representative electronic device 1062, the second representative electronic device 1064, or both, may include or correspond to the electronic device 900 of FIG. 9, or a component thereof, such as the SRAM device 964. As an illustrative, non-limiting example, the first representative electronic device 1062, the second representative electronic device 1064, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 1062, the second representative electronic device 1064, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the bit cell 100, the bit cell 400, and/or the bit cell 600, is integrated. As another illustrative, non-limiting example, one or more of the electronic devices 1062 and 1064 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 10 illustrates remote units according to teachings of the disclosure, the disclosure is not limited to these illustrated units. Embodiments of the disclosure may be suitably employed in any device which includes active integrated circuitry including memory and on-chip circuitry.

A device that includes the bit cell 100, the bit cell 400, and/or the bit cell 600, may be fabricated, processed, and incorporated into an electronic device, as described in the illustrative process 1000. One or more aspects of the embodiments disclosed with respect to FIGS. 1-10 may be included at various processing stages, such as within the library file 1012, the GDSII file 1026 (e.g., a file having a GDSII format), and the GERBER file 1052 (e.g., a file having a GERBER format), as well as stored at the memory 1010 of the research computer 1006, the memory 1018 of the design computer 1014, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity or by one or more entities performing various stages of the process 1000.

Although one or more of FIGS. 1-10 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

Although one or more of FIGS. 1-10 may illustrate systems, apparatuses, and/or methods according to the teachings of the disclosure, the disclosure is not limited to these illustrated systems, apparatuses, and/or methods. One or more functions or components of any of FIGS. 1-10 as illustrated or described herein may be combined with one or more other portions of another of FIGS. 1-10. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a bit cell including:
a first read port;
a second read port;
a write port;
a first storage latch coupled to the first read port and to the write port; and
a second storage latch coupled to the second read port and to the write port, a first side of the first storage latch connected to a first side of the second storage latch by a shorting connection, wherein a width of the bit cell is greater than twice a contacted poly pitch (CPP) associated with the bit cell.

2. The apparatus of claim 1, wherein the bit cell is manufactured using a semiconductor manufacturing process of less than 14 nanometers (nm).

3. The apparatus of claim 2, wherein the semiconductor manufacturing process comprises a 10 nm process.

4. The apparatus of claim 2, wherein the semiconductor manufacturing process comprises a 7 nm process.

5. The apparatus of claim 1, wherein the bit cell comprises a first metal layer.

6. The apparatus of claim 5, wherein the first metal layer does not include a non-linear pattern.

7. The apparatus of claim 5, wherein the bit cell comprises a second metal layer formed above the first metal layer, and wherein the second metal layer does not include a non-linear pattern.

8. The apparatus of claim 7, wherein the first metal layer and the second metal layer are patterned using a self-aligned double patterning (SADP) process.

9. The apparatus of claim 7, further comprising:
a first via connecting the first metal layer to the second metal layer; and
a second via connecting the first metal layer to the second metal layer, wherein a spacing between the first via and the second via is compatible with a two-mask litho-etch-litho-etch (LELE) process.

10. The apparatus of claim 9, wherein the spacing is greater than 60 nanometers (nm).

11. The apparatus of claim 1, wherein the width of the bit cell is greater than or equal to three times the CPP associated with the bit cell.

12. The apparatus of claim 1, wherein the CPP associated with the bit cell is approximately 60-66 nm.

13. The apparatus of claim 1, wherein the first read port and the second read port are on a second side of the first storage latch and the second storage latch, wherein the second side is opposite the first side.

14. The apparatus of claim 1, wherein the write port is configured to write first data into the first storage latch concurrently with writing the first data into the second storage latch.

15. A bit cell comprising:
first means for storing data by latching; and
second means for storing data by latching, wherein a first side of the first means for storing data is connected to a first side of the second means for storing data by a shorting connection.

16. The bit cell of claim 15, further comprising first means for reading data and second means for reading data, wherein the first means for reading data and the second means for reading data are on a second side of the first means for storing data and the second means for storing data, the second side opposite the first side.

17. The bit cell of claim 15, wherein a width of the bit cell is greater than twice a contacted poly pitch (CPP) associated with the bit cell.

18. A method comprising:
patterning a first metal layer of a bit cell by a self-aligned double patterning (SADP) process, wherein the bit cell includes a first read port, a second read port, and a write port and wherein a width of the bit cell is greater than twice a contacted poly pitch (CPP) associated with the bit cell;
patterning a second metal layer of the bit cell by the SADP process; and
forming a shorting connection between a first storage latch of the bit cell and a second storage latch of the bit cell, the first storage latch coupled to the first read port and to the write port, the second storage latch coupled to the second read port and to the write port.

19. The method of claim 18, wherein the bit cell is included in a static random access memory (SRAM) device.

20. The method of claim 18, wherein the write port is configured to write first data into the first storage latch concurrently with writing the first data into the second storage latch.

* * * * *